(12) United States Patent
Genshaft et al.

(10) Patent No.: US 10,127,103 B2
(45) Date of Patent: Nov. 13, 2018

(54) SYSTEM AND METHOD FOR DETECTING AND CORRECTING MAPPING TABLE ERRORS IN A NON-VOLATILE MEMORY SYSTEM

(71) Applicant: SanDisk Technologies LLC, Plano, TX (US)

(72) Inventors: Igor Genshaft, Bat Yam (IL); Marina Frid, Jerusalem (IL); Jonathan Journo, Shaarey Tikwa (IL)

(73) Assignee: SanDisk Technologies LLC, Plano, TX (US)

( * ) Notice: Subject to any disclaimer, the term of this patent is extended or adjusted under 35 U.S.C. 154(b) by 139 days.

(21) Appl. No.: 15/258,658

(22) Filed: Sep. 7, 2016

(65) Prior Publication Data

US 2018/0067799 A1   Mar. 8, 2018

(51) Int. Cl.
| | | |
|---|---|---|
| G06F 11/10 | (2006.01) | |
| G06F 12/1009 | (2016.01) | |
| G06F 3/06 | (2006.01) | |
| G11C 29/52 | (2006.01) | |

(52) U.S. Cl.
CPC .......... *G06F 11/1068* (2013.01); *G06F 3/064* (2013.01); *G06F 3/0619* (2013.01); *G06F 3/0685* (2013.01); *G06F 12/1009* (2013.01); *G11C 29/52* (2013.01); *G06F 2212/1032* (2013.01); *G06F 2212/657* (2013.01)

(58) Field of Classification Search
None
See application file for complete search history.

(56) References Cited

U.S. PATENT DOCUMENTS

| | | | | |
|---|---|---|---|---|
| 8,924,832 | B1 * | 12/2014 | Lam ........................ | G06F 12/06 702/117 |
| 9,817,725 | B2 * | 11/2017 | Tsai .................... | G06F 11/1469 |
| 2009/0158085 | A1 * | 6/2009 | Kern .................. | G06F 11/1064 714/6.13 |
| 2012/0066568 | A1 * | 3/2012 | Komagome ........ | G06F 11/1016 714/764 |
| 2012/0144249 | A1 * | 6/2012 | Franceschini ....... | G06F 11/1048 714/54 |
| 2014/0297964 | A1 * | 10/2014 | Nakase ............... | G06F 12/1054 711/136 |
| 2016/0147468 | A1 * | 5/2016 | Desai .................. | G06F 12/0246 711/162 |
| 2016/0147651 | A1 * | 5/2016 | Desai .................. | G06F 12/0246 711/103 |
| 2016/0284403 | A1 * | 9/2016 | Navon ................ | G06F 11/1068 |

\* cited by examiner

*Primary Examiner* — Justin R Knapp
(74) *Attorney, Agent, or Firm* — Brinks Gilson & Lione (57) ABSTRACT

A system and method is disclosed for detecting and correcting for errors in mapping table information stored in volatile memory of a non-volatile memory system. The method may include checking for mapping entry errors when retrieving mapping data for the non-volatile memory from a volatile memory cache. When an error is discovered, the method includes the processor generating a set of candidate mapping entries each having a different single bit difference from the mapping entry discovered to have an error. Each candidate is tested against one or more mapping data accuracy tests and, when one of the candidates is found to be a correct mapping entry based on the one or more tests, the original mapping table entry with the determined defect is replaced with the successful candidate mapping entry.

17 Claims, 7 Drawing Sheets

SYSTEM AND METHOD FOR DETECTING AND CORRECTING MAPPING TABLE ERRORS IN A NON-VOLATILE MEMORY SYSTEM

BACKGROUND

Non-volatile memory systems, such as solid state drives (SSDs) including NAND flash memory, are commonly used in electronic systems ranging from consumer products to enterprise-level computer systems. Controllers in some SSDs often manage high throughput data traffic between one or more hosts and the multiple non-volatile memory die in the SSD. Additionally, modern high-performance storage devices such as the SSDs mentioned above often include a volatile dynamic random access memory (DRAM) cache used to store mapping tables, executable firmware code, and other data. This cache is often susceptible to bit flips, and as such needs protection. One approach for handling bit flips in data is to provide end to end error protection for any type of data that is read from or written to DRAM. The end to end protection includes specialty hardware positioned in the data path that can detect and correct errors in real time. In some memory controller architectures, the specialty hardware, sometimes referred to as an error correction code (ECC) engine, may not be included in the data path used to access and store mapping table data.

DETAILED DESCRIPTION

A system and method for detecting and correcting mapping table data in a non-volatile memory system is disclosed that can correct for bit flips in a cached version of the mapping table data by the controller to identify the location of data in the non-volatile memory of the memory system. The disclosed system and method do not utilize a dedicated ECC engine, that includes hardware positioned in the data path between the cache and the one or more processors of the memory system, that can identify and/or correct firmware retrieved from the cache in real time. Instead, the disclosed method and system utilize the processor of the controller that is retrieving a mapping data entry to review the mapping data entry for bit flips and then take steps to correct the erroneous mapping table entry and save the corrected version.

According to a first aspect, a method of managing mapping data in a non-volatile memory system is disclosed where the non-volatile memory system includes a controller in communication with a volatile memory and a non-volatile memory. The method includes the controller generating a mapping entry for a piece of data, the mapping entry mapping a logical address for the piece of data to a physical location in non-volatile memory containing the piece of data. The controller also generating error correction data for the mapping entry and storing the mapping and the error correction data in the volatile memory. The method further includes, when the mapping entry is accessed from the volatile memory, regenerating the error correction data for the mapping entry and comparing the regenerated error correction data to the error correction data previously stored in the volatile memory. When the regenerated error correction data does not match the error correction data stored in the volatile memory, the method includes inverting one or more of a plurality of bits of the mapping entry to create a revised mapping entry, determining if the revised mapping entry correctly identifies the physical location of the piece of data, and then replacing the mapping entry with the revised mapping entry in the volatile memory when the revised mapping entry is determined to correctly identify the physical location of the piece of data.

According to another aspect, a non-volatile memory system is disclosed. The non-volatile memory system includes a non-volatile memory, a volatile memory, and a controller in communication with the volatile memory and the non-volatile memory. The controller is configured to detect whether an error is present when accessing a mapping table entry and associated error correction data from the volatile memory. The controller is further configured to, when the error is detected, invert one or more bits in the mapping table entry to create a revised mapping table entry and generate revised error correction data for the revised mapping table entry.

In another aspect, a method of managing mapping data in a volatile memory of a non-volatile memory system is disclosed, where the non-volatile memory system has a controller in communication with the volatile memory and a non-volatile memory. The method may include the controller accessing a mapping table entry from the volatile memory and determining of the mapping table entry contains an error. When the mapping table entry contains an error, the method includes generating a revised mapping table entry, testing the revised mapping table entry to determine if the revised table entry is correct and replacing the mapping table entry in the volatile memory with the revised mapping table entry when the revised table entry is determined to be correct. The initial determination of an error in the mapping table entry may be made by comparing a checksum generated from the entry upon retrieval to a previously stored checksum value for the particular mapping table entry. The generation of a revised mapping table entry may be the creation of multiple revised mapping entry candidates, each having only one bit inverted from the mapping table entry and each revised mapping table entry having a different one bit inverted. The testing of the revised mapping table entry may include regenerating the checksum for each revised mapping table entry and comparing that to the previously stored checksum.

In yet another aspect, a non-volatile memory system includes a non-volatile memory storing a plurality of data and a volatile memory having a cached version of a mapping table mapping logical addresses to associated physical addresses of the plurality of data in the non-volatile memory. The non-volatile memory system also includes means for detecting whether an error is present when accessing a mapping table entry from the volatile memory and for inverting only one bit of the mapping table entry to create a revised mapping table entry when the error is detected.

Figures 1A, 1B:
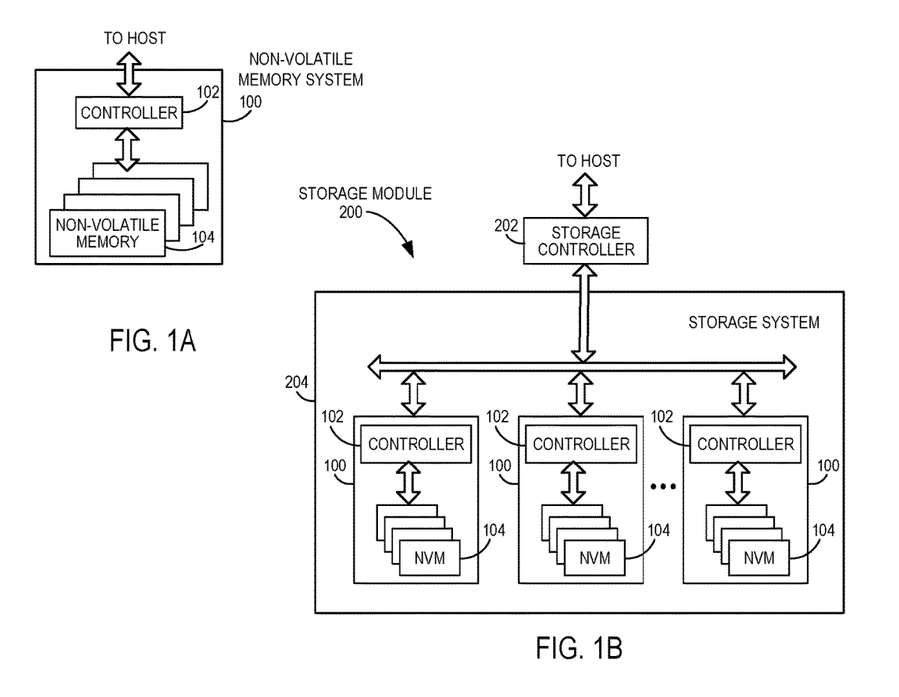
FIG. 1A is a block diagram of an example non-volatile memory system.
FIG. 1B is a block diagram illustrating an exemplary storage module.

FIG. 1A is a block diagram illustrating a non-volatile memory system. The non-volatile memory (NVM) system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, one or more microprocessors or processors (also referred to herein as central processing units (CPUs)), and a computer-readable medium that stores computer-readable program code (e.g., software or firmware) executable by the (micro)processors, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A NVM system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural NVM systems 100. As such, storage module 200 may include a storage controller 202 that interfaces with a host and with storage system 204, which includes a plurality of NVM systems 100. The interface between storage controller 202 and NVM systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
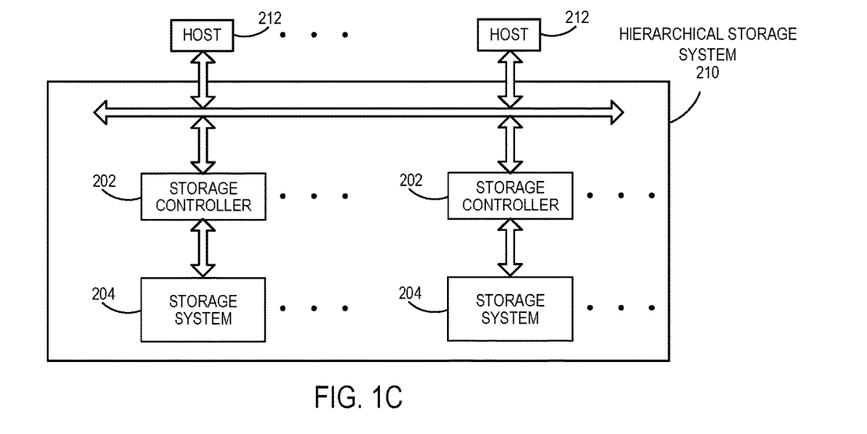
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
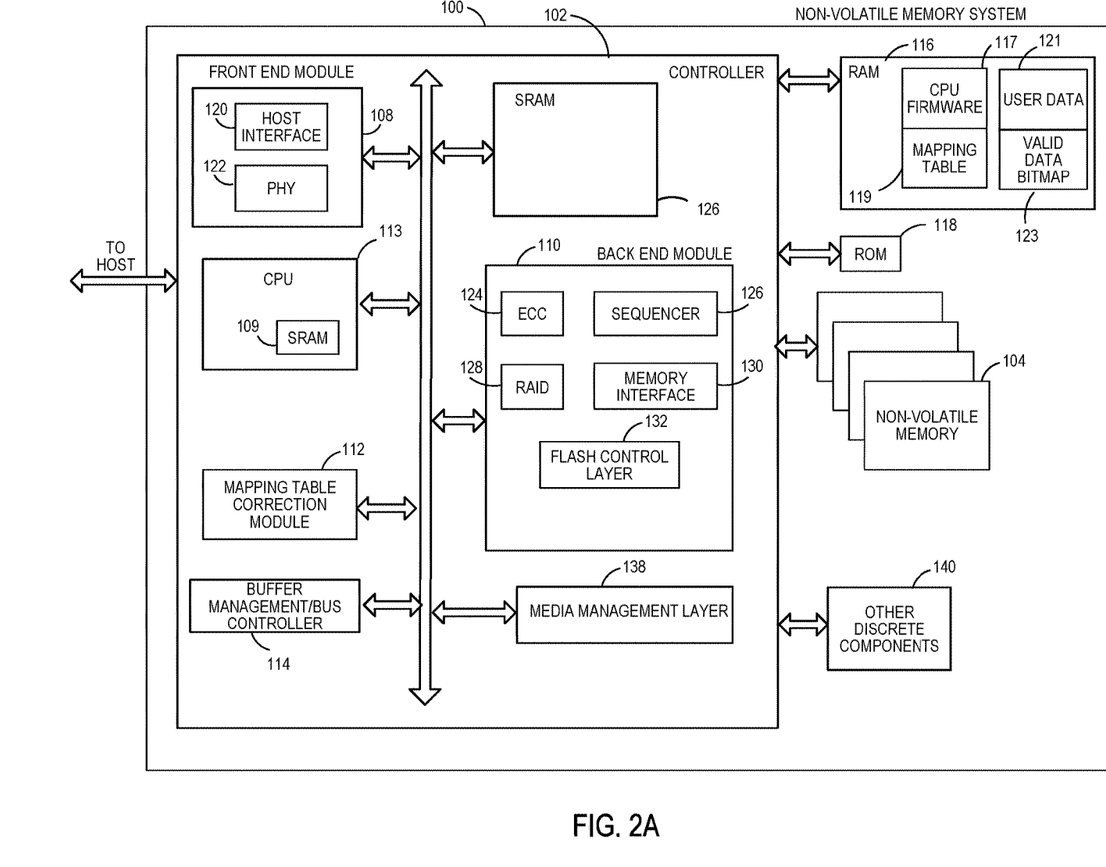
FIG. 2A is a block diagram illustrating exemplary components of a multi-processor controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. In one embodiment, one or more hardware processors, one example of which is central processing unit (CPU) 113, may be part of or assigned to the front end module 108, the back end module 110 and the media management layer 138 (also referred to as the flash translation layer).

Modules of the controller 102 may include a mapping table correction module 112 to provide functionality for managing the detection and correction of mapping table data retrieved from a cache such as random access memory (RAM) 116. For example, the mapping table correction module 112 may include error correction code (ECC) instructions for use by the CPU 113. The ECC instructions may be for any of a number of known ECC techniques ranging from basic one bit or multiple bit parity checks, to checksum algorithms such as the Adler-32 algorithm described in RFC 1950, the CRC-32 algorithm described in the IEEE 802 specification and used in the SATA protocol, or any other algorithm commonly used for determining data integrity. The ECC instructions for identifying mapping table data corruption may be as basic as an exclusive or (XOR) process of all the bits in a mapping address value of a mapping table entry or may include more advanced error correction algorithms such as a Hamming code. Any ECC technique that permits detection of single bit errors may be utilized.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM 116 and ROM 118 may be located both within the controller 102 and outside the controller. Further, in some implementations, the controller 102, RAM 116, and ROM 118 may be located on separate semiconductor die.

The RAM 116 may be dynamic random access memory (DRAM) and be used as a cache for various types of data. As described in greater detail below, the RAM 116 in the NVM system 100, whether outside the controller 102, inside the controller or present both outside and inside the controller 102, may include a portion having a copy of the processor executable instructions, also referred to herein as firmware 117, for the one or more CPUs 113. The RAM 116 may include a portion containing a copy of the some or all of the mapping table 119 of the NVM system 102 and a portion used for user data 121 being written to or read from the non-volatile memory 104. Additionally, RAM 116 may include a valid data bitmap 123 that tracks physical addresses in non-volatile memory 104 currently holding valid data.

The original version of the CPU firmware may be stored in the non-volatile memory 104 and when the NVM system 100 is connected to a host, the CPU firmware 117 may be written to RAM 116. Similarly, the data for the mapping table 119 may be retrieved from the primary mapping table maintained in non-volatile memory 104, including ECC data, such as parity or checksum data, that the CPU 113 can use to verify the integrity of the data in the mapping table 119. The mapping table 119 may include logical-to-physical address mapping for the user data in the NVM system 100, where logical block addresses (LBAs) referenced by a host are mapped to the current physical address in non-volatile memory 104 where the data associated with a particular LBA or set of LBAs is currently stored.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the NVM system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of NVM system 100 illustrated in FIG. 2A include the media management layer 138, which performs wear leveling of memory cells of non-volatile memory die 104 and manages mapping tables and logical-to-physical mapping or reading tasks. NVM system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
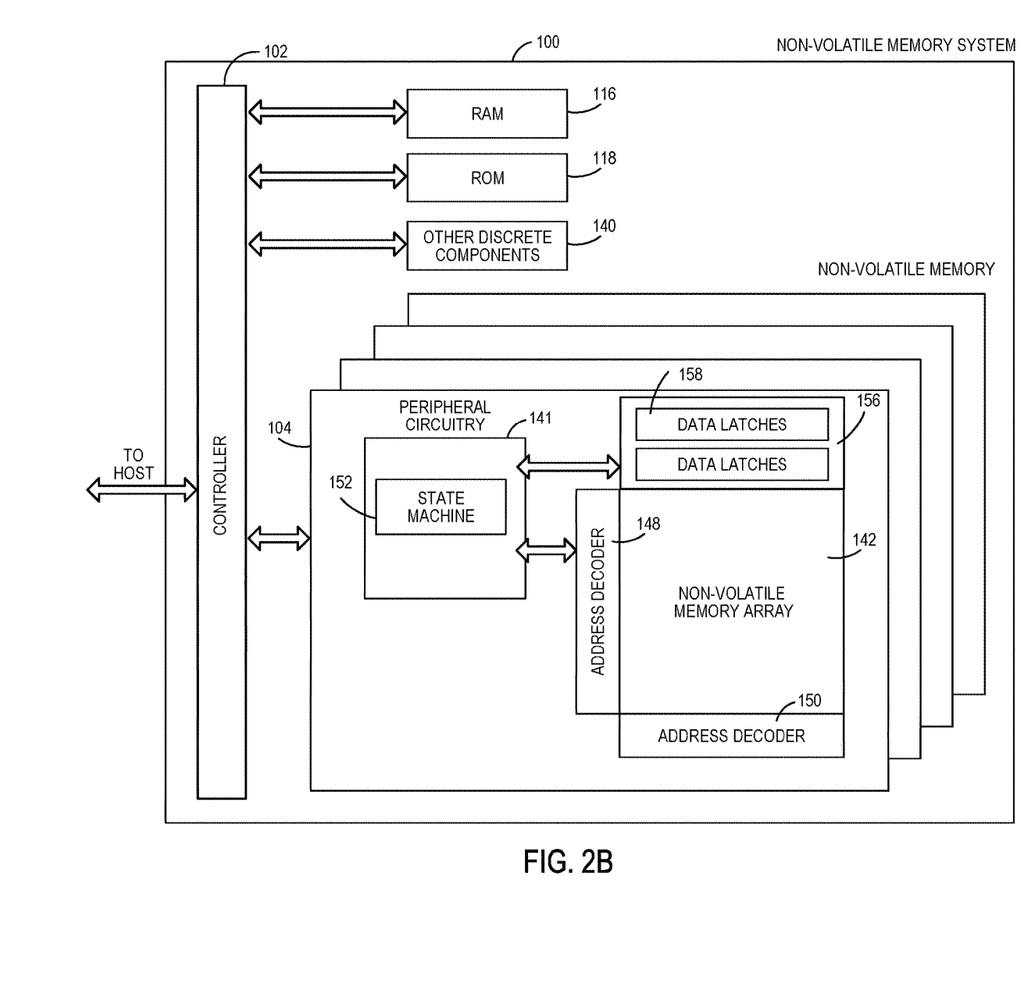
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or a three dimensional configuration. As an example of the arrangement of the non-volatile memory cells, the memory cells may be arranged in minimum units of erase referred to as blocks, where each block is composed of a predetermined number of pages and each page is composed of a predetermined number of bits. Peripheral circuitry 141 includes a state machine 152 that provides status information to controller 102. Non-volatile memory die 104 further includes a data cache 156 that caches data being read from or programmed into the non-volatile memory cells of the non-volatile memory array 142. The data cache 156 comprises sets of data latches 158 for each bit of data in a memory page of the non-volatile memory array 142. Thus, each set of data latches 158 may be a page in width and a plurality of sets of data latches 158 may be included in the data cache 156. For example, for a non-volatile memory array 142 arranged to store n bits per page, each set of data latches 158 may include n data latches where each data latch can store 1 bit of data.

In one implementation, an individual data latch may be a circuit that has two stable states and can store 1 bit of data, such as a set/reset, or SR, latch constructed from NAND gates. The data latches 158 may function as a type of volatile memory that only retains data while powered on. Any of a number of known types of data latch circuits may be used for the data latches in each set of data latches 158. Each non-volatile memory die 104 may have its own sets of data latches 158 and a non-volatile memory array 142. Peripheral circuitry 141 includes a state machine 152 that provides status information to controller 102. Peripheral circuitry 141 may also include additional input/output circuitry that may be used by the controller 102 to transfer data to and from the latches 158, as well as an array of sense modules operating in parallel to sense the current in each non-volatile memory cell of a page of memory cells in the non-volatile memory array 142. Each sense module may include a sense amplifier to detect whether a conduction current of a memory cell in communication with a respective sense module is above or below a reference level.

Figure 3:
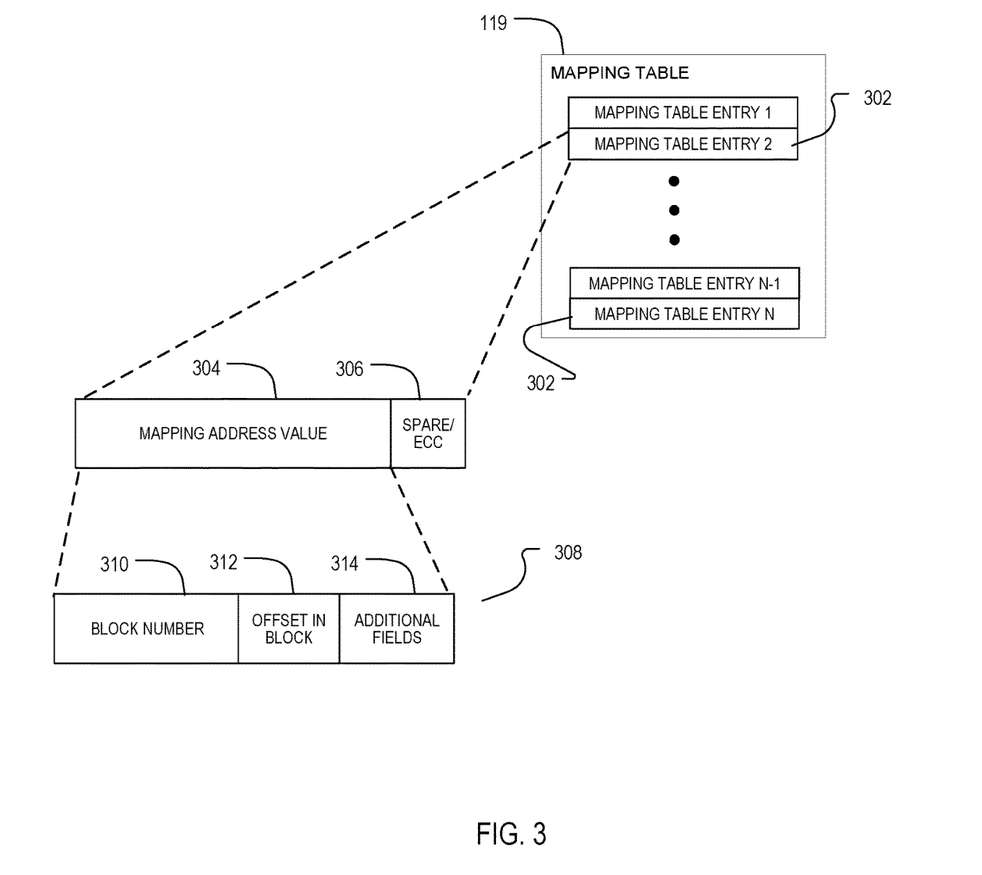
FIG. 3 illustrates an example mapping table and mapping table entry format for use in the non-volatile memory system of FIGS. 2A-2B.

Referring to FIG. 3, one implementation of an arrangement of mapping data in the mapping table 119 maintained in RAM 116 (FIG. 2A) is shown. The mapping table 119 may include individual mapping table entries 302 for each LBA. Each mapping table entry 302 may be of a predetermined number of bytes, for example 32 bits, where the address value 304 in the mapping table entry 302 takes up a first portion of the mapping table entry, for example 28 bits, and the remainder of the entry 302 is made up of spare bits, for example 4 bits, that may be used to store the ECC data that the CPU 113 may use to identify and help correct a flipped bit error in the mapping table entry 302. Within the address value 304 of the mapping table entry 302, the address data may be formatted in a particular address format 308. For example, the first bits of the address value may be assigned to a physical block number 310 in the non-volatile memory 104, followed by bits identifying an offset 312 within that block where the desired data may be found. Additional address value fields 314 may be included depending on the application. For example, one additional field 314 may be a die number within which the block resides if there are multiple non-volatile memory die 104. The 32-bit mapping table entry described above is provided only by way of example. Any of a number of larger or smaller mapping table entry sizes and relative sizes of mapping value bits to spare bits in the entry are contemplated. Similarly, the format 308 of the address value shown is one example and may be any predetermined format used for the particular memory application in other implementations. Additionally, rather than having ECC data stored in the mapping table entries 302, in alternative embodiments the ECC information for each respective mapping table entry 302 may be separately stored, for example in another location in RAM 116 or other memory accessible by the CPU 113.

Figure 4:
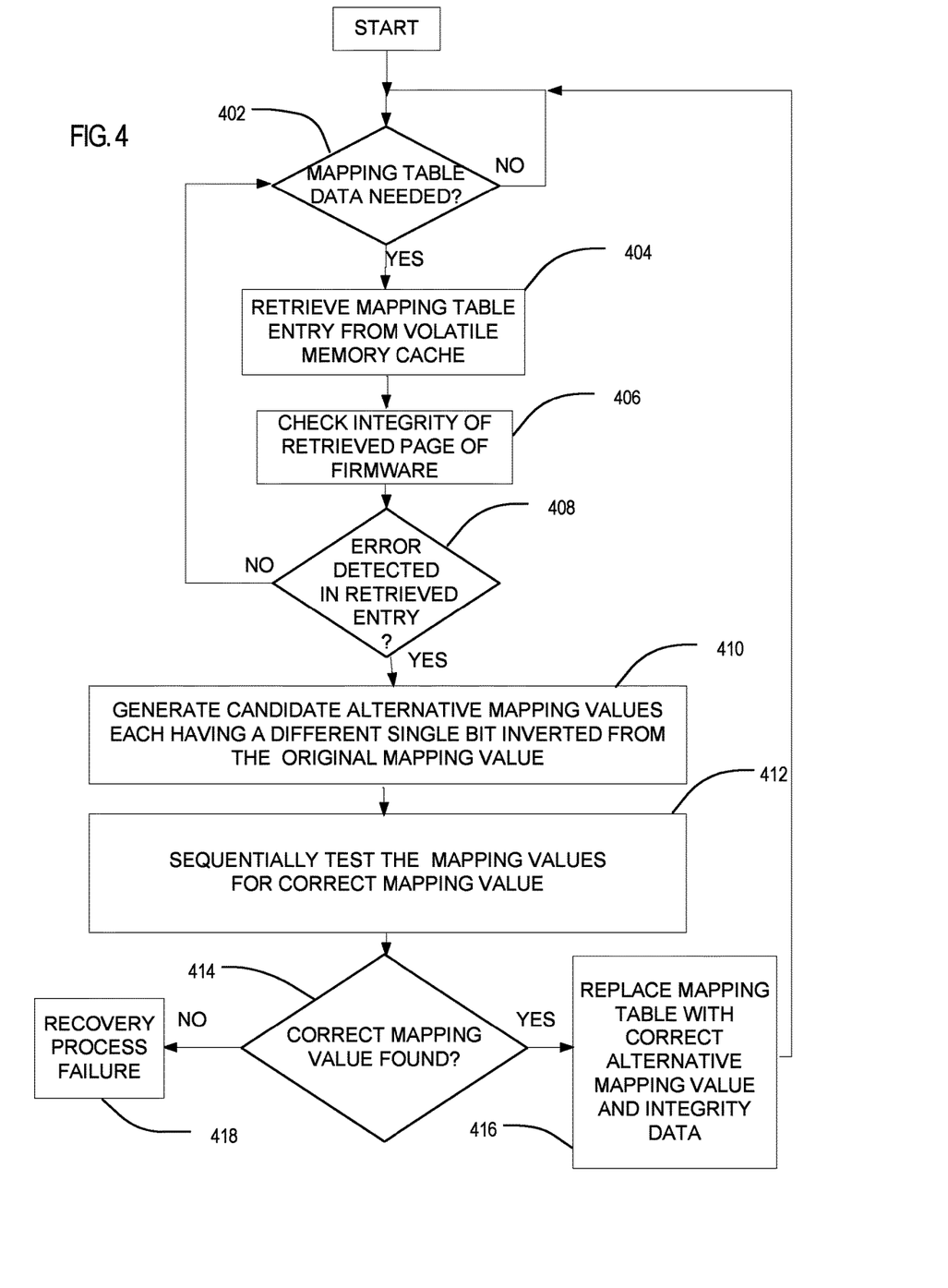
FIG. 4 is a flow diagram of a process for detecting and correcting for mapping table entry errors in a cached mapping table maintained in volatile memory.

A method for detecting and correcting errors in mapping table data by a processor, such as CPU 113, accessing and storing mapping table data into a mapping table cache, such as the mapping table 119 in RAM 116, is described in FIG. 4. Whenever a mapping table entry 302 is created or changed, the CPU 113 calculates and stores a checksum value or other ECC data and stores it in the spare bit region 306 of the entry 302 or in another location as noted above. Each time the CPU 113 needs to access a mapping table entry 302 (at 402), the CPU retrieves the desired mapping table entry from RAM 116 and checks the integrity of the mapping table entry (at 404, 406). The integrity check may involve the CPU 113 utilizing instructions from the mapping table correction module 112 and/or the CPU firmware 117 to generate a new ECC value, for example a checksum value, for the mapping table entry and then comparing that generated value to the previously stored value in the spare bits 306 of the entry or stored elsewhere in the NVM system 100.

If an error is detected (at 408), for example the generated and retrieved checksum values do not match, then the CPU 113 will proceed with attempting to find the correct mapping value. The CPU 113 will generate alternative mapping value candidates by inverting only one bit from the original retrieved mapping address value 304 (at 410). Where each candidate has a different bit flipped from the original retrieved mapping address value. Thus, the number of possible alternative candidates would equal the number of bits of the mapping address value. For simplicity of illustration, if the mapping entries 302 for the mapping table 119 only included 4 bits for the mapping address value space and the retrieved mapping value was 1001, the generated alternative mapping value candidates would be 1000, 1011, 1101 and 0001 where each candidate generated by the CPU 113 is only 1 bit different than the original mapping address value.

The CPU 113 sequentially tests each alternative mapping value, as well as the original mapping value, until a correct mapping value is found (at 412). If the correct mapping value is found (at 414), then the CPU 113 will replace the retrieved mapping entry 302 with the correct mapping value and associated ECC value. Because the method assumes a single bit error, however, the generated alternative mapping values may all fail if more than 1 bit was corrupted in the original mapping address value 304 retrieved from RAM 116 (at 418).

Figure 5:
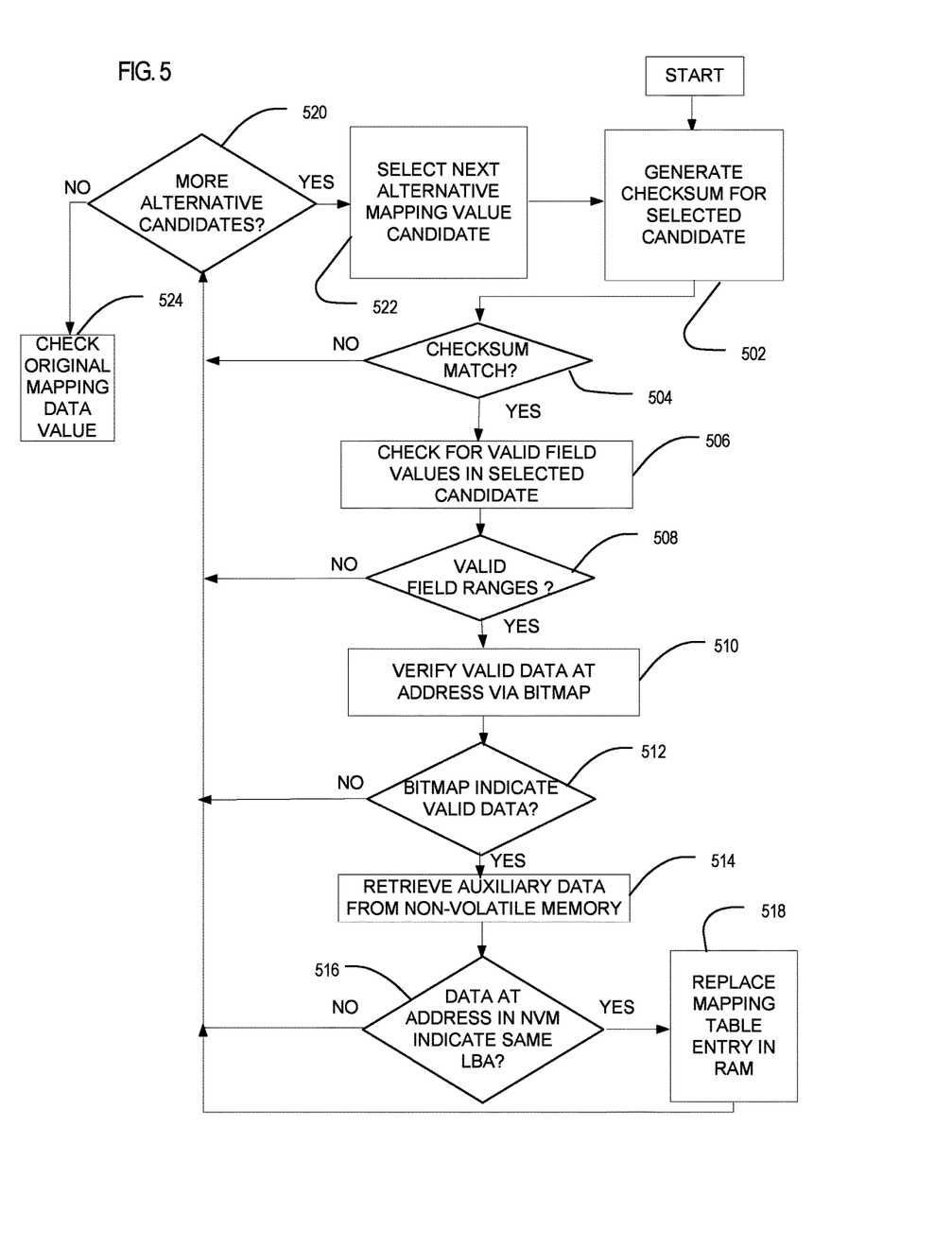
FIG. 5 is a flow diagram detailing tests for verifying validity of alternative mapping address values generated in the process of FIG. 4

One example of the sequential determination of which alternative mapping value is the correct one identified in step (412 of FIG. 4) is shown in FIG. 5. In the example of FIG. 5, the sequential determination step may include applying multiple predetermined tests in order to a first mapping address value candidate, where failure of any of the tests will cut off any further testing for that alternative mapping value candidate and a next one of the candidates is tested. As shown in FIG. 5, a first test for an alternative mapping address value candidate may be for the CPU to generate checksum data for the candidate and compare that value to the retrieved value for the original mapping value in RAM (at 502). If the candidate mapping value does not match the retrieved checksum value (at 504), then that candidate is disqualified without further testing and a next one of the alternative candidate mapping address values is selected and tested (at 520, 522).

When a selected mapping address value candidate does have a checksum that matches the original retrieved checksum, then the CPU may examine the fields 308 in the selected mapping address value 304 to see if they are valid given the known value ranges (at 506, 508). For example, the CPU 113 may read the bits in the selected mapping address value and see if, the value of the block number field (see, e.g., FIG. 3, item 310) found in the candidate mapping address value 304 falls in the known range of blocks. This, if the block number read from the candidate mapping address was a number greater than 1000 and the known maximum numbers of blocks in the system was only 1000, the candidate mapping address value would fail. This known range information for each of the predetermined fields 308 may be retrieved by the CPU 113 from a derivation of manufacturing parameters pre-initialized before the process is run and stored in SRAM 126 or non-volatile memory 104. If the values in the candidate mapping address value do not all fall within expected ranges, then a next candidate mapping address value is selected and testing begins again for that new candidate.

When a candidate mapping address value passes the first two tests, a next test the CPU 113 may initiate is to check whether the address in the non-volatile memory 104 identified by the candidate mapping address value is referencing valid data. The CPU 113 may check the candidate mapping address value against a valid data bitmap 123, or other data structure, in RAM 116 that tracks which physical addresses currently contain valid data (at 510). Although the data structure example for tracking valid data is shown as a bitmap 123 in RAM 116, other data structure types and/or other locations in volatile or non-volatile memory are contemplated. If no valid data is indicated at that address by the bitmap check, the test is failed (at 512). Again, if the test is failed, that candidate mapping address value is discarded and the next one is run through the above-noted tests until a test is failed or all tests are passed (at 512, 520, 522).

If the mapping address value passes the valid data check (at 512), then the CPU 113 will perform a final test and read auxiliary information in non-volatile memory 104 containing the LBA identifier for the data stored at that physical location identified by the mapping address value under consideration (at 514). The auxiliary information may be stored in the header data at the physical address identified by the mapping address value. If the LBA read from the non-volatile memory storage location matches the LBA that triggered the CPU 113 to access the mapping table 119 in RAM 116 in the first place, then there is confirmation that the current candidate mapping address value is correct and that mapping address is used to replace the incorrect mapping address value (at 516, 518). The CPU 113 may generate a new checksum or other ECC value and store it with or separately from the version of the mapping address value found to be correct.

It is possible that an error of greater than one bit is present in the original mapping address value retrieved from RAM, in which case none of the candidates generated with only a single respective bit flipped from that original value will pass the tests. However, because the transient bit flip in the mapping table that lead to the initial checksum error may actually have been caused by a bit flip in the ECC data 306 in the mapping table entry 302 and not in the mapping address value 304, it is possible that the original mapping address value 304 is correct. Accordingly, a check by the CPU 113 of the validity of the original mapping address value 304 may be performed skipping the checksum test and applying one or more of the remaining tests of FIG. 5 (Checking for valid field ranges, checking that valid data is present at the physical address identified, and comparing the requested LBA triggering the table access with LBA data in no-volatile memory found at the physical address identified) (at 524). If the original mapping address value is actually correct, then the tests other than the skipped checksum test will be passed and the CPU will generate and replace the original checksum value with a corrected checksum value. This check of the original mapping address value may be performed before, after or during the testing of the CPU-generated single bit flip alternative address candidates discussed above.

The process of the CPU 113 checking the integrity of cached mapping table data in RAM may be scaled to multiple processors in a multi-processor controller. Each processor in such an architecture may perform its own check on mapping table entries 302 it uses from RAM 116. Also, the number and type of the tests that a CPU performs on the alternative mapping address values it generates after detecting a bit error may the same or different than those specific examples provided above.

Figure 6:
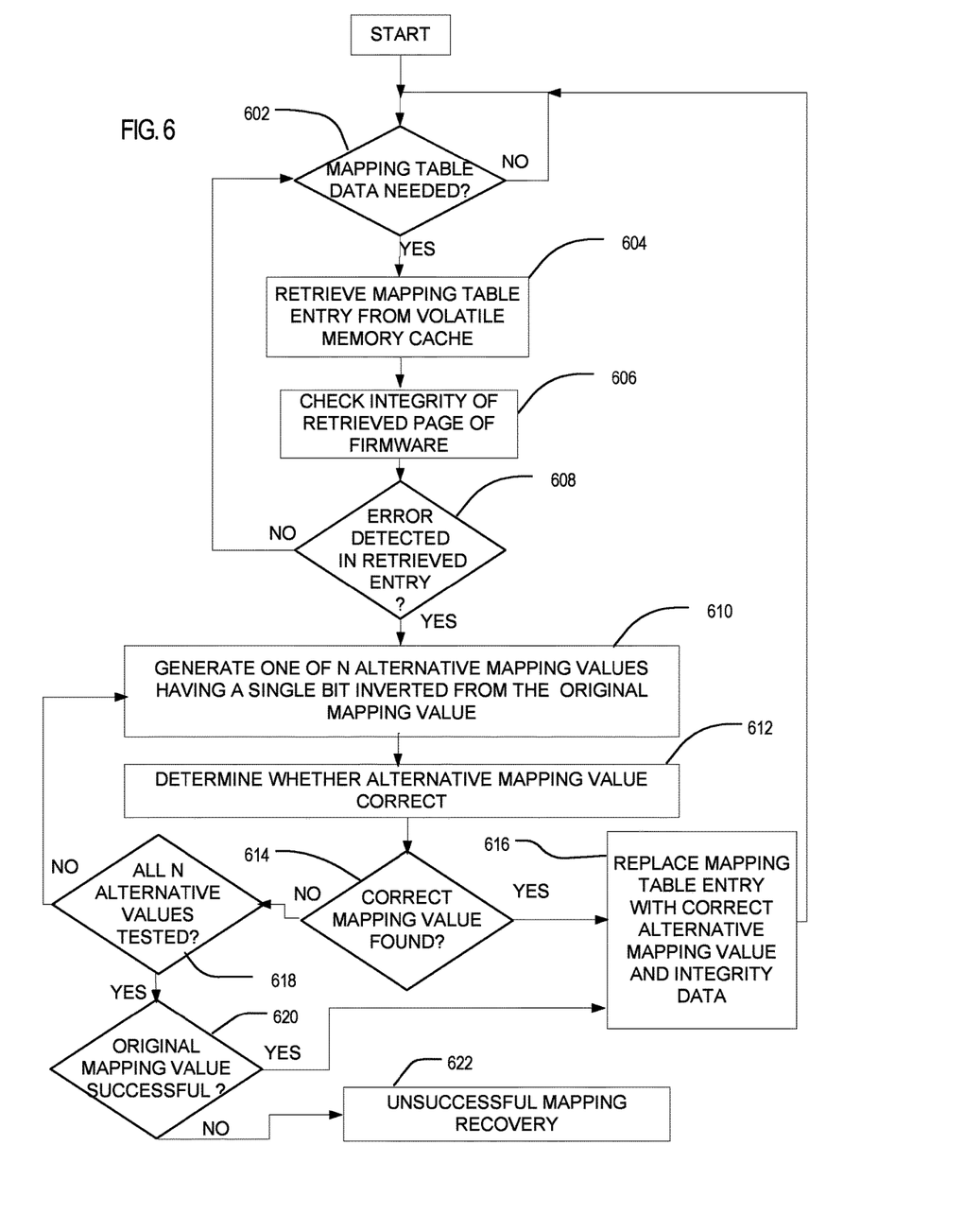
FIG. 6 illustrates an alternative embodiment of the process of FIG. 4.

In the examples of FIGS. 4-5, the generation of alternative single bit-flipped mapping address values is discussed in the context of the CPU 113 first generating all of the single bit flip alternatives and then sequentially running tests on a given generated candidate until that candidate fails before going to the next already generated candidate. In other embodiments, such as illustrated in FIG. 6, the CPU 113 may generate one single bit-flipped alternative mapping address value at a time, test that one alternative mapping address value and then proceed with generating and testing a next single bit-flipped alternative. The initial process of detecting a mapping table access at the CPU 113 (at 602), and the subsequent steps of retrieving the mapping table entry from RAM 116 for the requested LBA (at 604), checking the integrity (checksum or other ECC error check) of the retrieved entry (at 606) and then initiating the process of recovering correct address information if an error is found (at 608) is the same as in FIG. 4. However, in the embodiment of FIG. 6, the instructions for the CPU 113 from the mapping table correction module 112 and/or CPU firmware 117 cause the CPU 113 to first generate one single bit-flipped alternative candidate for a mapping table value (at 610) and the then test that one alternative candidate (at 612) before generating any additional alternative mapping address values having a single bit flip from the original mapping address value retrieved from RAM 116.

As noted previously, the CPU only generates a candidate mapping address value to correct the original mapping address value identified as having an error by only flipping one of the bits from the original for any given candidate. Thus a mapping table entry 302 with an N bit (N being a whole number) mapping address value field will yield a possible of N generated alternative mapping address values that differ from one another and the original mapping address value by one bit. In the embodiment of FIG. 6, the CPU 113 only generates one of the N alternatives before testing and either accepting (at 614, 616) or rejecting that alternative. Only when a candidate is rejected as incorrect after testing is another alternative generated and tested (at 612, 614, 618, 610). If all N possibilities have been tried, the original mapping address value is tried as well (at 620) using one or more of the above-noted tests in FIG. 4 without using the ECC test. If the original mapping address passes the tests, that value is rewritten to RAM 116 with corrected ECC data (at 620, 616). If the original mapping address value also fails the tests, then the mapping recovery process is deemed unsuccessful then the mapping recovery process for that entry is considered to have failed (at 620, 622). If all attempts fail, the NVM system 100 may stop responding to or fail write commands in order to protect data, or may raise a critical fault indicator to the host in order to trigger a reset, or may fail access to LBAs associated with this mapping entry.

Although an iterative process of changing a single bit from the original bits of a mapping table entry are discussed, it is contemplated that alternative mapping address value candidates having more than one bit flipped may be generated in other embodiments. This can be done (for example with two bits) by flipping multiple bits in sequence until all possibilities are exhausted. For example, if mapping address value 304 is 28 bits long, this would require checking 813 different bit combinations ($28^2$ two-bit combinations, plus $28^1$ one-bit combinations, plus the original value).

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

Methods and systems have been disclosed for implementing a non-volatile memory system where transient bit flips in a cached version of the mapping table information stored in volatile memory are searched and corrected for when the processor retrieving a mapping entry from the cache identifies an error. The process may include creating a pool of single bit flipped alternatives to the mapping entry that was found to have an error and sequentially subjecting the alternatives to validity tests until a corrected mapping entry is discovered. Alternatively, one alternative mapping entry at a time, each with a single bit flip difference from the original mapping entry believed to have an error, may be generated and tested for validity before a next candidate is generated and tested.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A method of managing mapping data in a non-communication volatile memory system, the non-volatile memory system having a controller in communication with a volatile memory and a non-volatile memory, wherein the method comprises the controller:
   generating a mapping entry for a piece of data, the mapping entry mapping a logical address for the piece of data to a physical location in non-volatile memory containing the piece of data;
   generating error correction data for the mapping entry;
   storing the mapping and the error correction data in the volatile memory;
   when the mapping entry is accessed from the volatile memory:
      regenerating the error correction data for the mapping entry;
      comparing the regenerated error correction data to the error correction data previously stored in the volatile memory;
   when the regenerated error correction data does not match the error correction data stored in the volatile memory:
      inverting one or more of a plurality of bits of the mapping entry to create a revised mapping entry;
      applying multiple predetermined tests in a predetermined order to the revised mapping entry, wherein the multiple predetermined tests comprises:
         comparing error correction data of the revised mapping entry to error correction data of the mapping entry; and
         examining address mapping fields of the revised mapping entry to determine whether a value of each address mapping field falls within a valid range of values;
      determining if the revised mapping entry correctly identifies the physical location of the piece of data based on the application of the multiple predetermined tests; and
      replacing the mapping entry with the revised mapping entry in the volatile memory when the revised mapping entry is determined to correctly identify the physical location of the piece of data.

2. The method of claim 1, wherein inverting one or more of the plurality of bits comprises inverting only one of the plurality of bits.

3. The method of claim 2, further comprising:
   when the revised mapping entry is determined not to correctly identify the physical location of the piece of data, inverting a different one of the plurality of bits of the mapping entry to create a subsequent revised mapping entry, determining if the subsequent revised mapping entry correctly identifies the physical location and replacing the mapping entry in volatile memory with the subsequent revised mapping entry when the subsequent revised mapping entry correctly identifies the physical location.

4. The method of claim 1, wherein the multiple predetermined tests further comprises: verifying that a physical address identified by the revised mapping entry is associated with a valid programmed block in the non-volatile memory.

5. The method of claim 1, wherein generating error correction data comprises generating parity information using an exclusive OR (XOR) operation.

6. The method of claim 5, wherein the generating parity information comprises generating a single bit checksum of the piece of data.

7. A non-volatile memory system comprising:
   a non-volatile memory;
   a volatile memory; and
   a controller in communication with the volatile memory and the non-volatile memory, the controller configured to:
      detect whether an error is present when accessing a mapping table entry and associated error correction data from the volatile memory; and
      when the error is detected;
         invert one or more bits in the mapping table entry to create a revised mapping table entry;
         apply multiple predetermined tests in a predetermined order to the revised mapping table entry, wherein to apply the multiple predetermined tests the controller is configured to:
            compare error correction data of the revised mapping table entry to error correction data of the mapping table entry; and
            examine address mapping fields of the revised mapping table entry to determine whether a value of each address mapping field falls within a valid range of values;
         generate revised error correction data for the revised mapping table entry based in part on the application of the multiple predetermined tests; and
         in response to determining that the revised mapping table entry is associated with valid data in the non-volatile memory, replace the mapping table entry with the revised mapping table entry.

8. The non-volatile memory system of claim 7, wherein the controller is further configured to
   detect whether revised error correction data matches the associated error correction data; and
   when the revised error correction data matches the associated error correction data, determine whether the revised mapping table entry is associated with valid data in the non-volatile memory.

9. The non-volatile memory system of claim 7, wherein when the error is detected, the controller is configured to only invert one of the bits in the mapping table entry to create the revised mapping table entry.

10. The non-volatile memory system of claim 7, wherein the non-volatile memory comprises a substrate formed with a three-dimensional memory structure.

11. The non-volatile memory system of claim 7, wherein to invert one or more bits in the mapping table entry to create a revised mapping table entry the controller is configured to generate a plurality of revised mapping table entries, each of the plurality of revised mapping table entries having only one bit flipped from original bits in the mapping table entry, wherein the one bit flipped is different in each of the plurality of revised mapping table entries.

12. The non-volatile memory system of claim 11, wherein the controller is configured to sequentially examine each of the plurality of revised mapping table entries and, upon determining that one of the revised mapping table entries is correct, replacing the mapping table entry with the one of the revised mapping table entries in the volatile memory.

13. A method of managing mapping data in a volatile memory of a non-volatile memory system, the non-volatile memory system having a controller in communication with the volatile memory and a non-volatile memory, wherein the method comprises the controller:
  accessing a mapping table entry from the volatile memory;
  determining if the mapping table entry contains an error;
  when the mapping table entry contains an error:
    generating a revised mapping table entry;
    testing the revised mapping table entry to determine if the revised mapping table entry is correct, wherein testing the revised mapping table entry comprises:
      comparing error correction data of the revised mapping table entry to error correction data of the mapping table entry; and
      examining address mapping fields of the revised mapping table entry to determine whether a value of each address mapping field falls within a valid range of values; and
    replacing the mapping table entry in the volatile memory with the revised mapping table entry when the testing indicates that the revised mapping table entry is determined to be correct.

14. The method of claim 13, wherein generated a revised mapping table entry comprises the controller inverting only one bit of the mapping table entry to generate the revised mapping table entry.

15. The method of claim 13, wherein generating a revised mapping table entry comprises the controller creating a plurality of revised mapping table entry candidates, each of the plurality of revised mapping table entry candidates having a different bit inverted from the mapping table entry; and
  wherein testing the revised mapping table entry comprises sequentially testing each revised mapping table entry candidates until a revised mapping table entry candidate is determined to be correct.

16. The method of claim 15, wherein one revised mapping table entry candidate is generated, and that one revised mapping table entry candidate tested to determine if it is correct, prior to generating and testing a next one of the plurality of revised mapping table candidates.

17. A non-volatile memory system comprising:
  a non-volatile memory storing a plurality of data;
  a volatile memory having a cached version of a mapping table mapping logical addresses to associated physical addresses of the plurality of data in the non-volatile memory;
  means for detecting whether an error is present when accessing a mapping table entry from the volatile memory;
  means for inverting only one bit of the mapping table entry to create a revised mapping table entry when the error is detected;
  means for applying multiple predetermined tests in a predetermined order to the revised mapping table entry, wherein the multiple predetermined tests comprises:
    comparing error correction data of the revised mapping table entry to error correction data of the mapping table entry; and
    examining address mapping fields of the revised mapping table entry to determine whether a value of each address mapping field falls within a valid range of values;
  means for generating revised error correction data for the revised mapping table entry based in part on the application of the multiple predetermined tests; and
  means for, in response to determining that the revised mapping table entry is associate with valid data in the non-volatile memory, replacing the mapping table entry with the revised mapping table entry.

* * * * *